(12) United States Patent
Takizawa

(10) Patent No.: US 7,570,509 B2
(45) Date of Patent: Aug. 4, 2009

(54) SEMICONDUCTOR DEVICE, LOGIC CIRCUIT AND ELECTRONIC EQUIPMENT

(75) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 144 days.

(21) Appl. No.: 11/851,861

(22) Filed: Sep. 7, 2007

(65) Prior Publication Data

US 2008/0116939 A1      May 22, 2008

(30) Foreign Application Priority Data

Nov. 17, 2006   (JP)   .............................. 2006-311734

(51) Int. Cl.
*G11C 11/00*   (2006.01)
(52) U.S. Cl. ...................... 365/156; 365/154; 365/63; 257/348; 257/E21.7; 257/536
(58) Field of Classification Search ................ 365/156, 365/154, 63; 326/103; 257/348, 536, E21.7
See application file for complete search history.

(56) References Cited

U.S. PATENT DOCUMENTS

| | | | |
|---|---|---|---|
| 6,535,453 B2 * | 3/2003 | Nii et al. ................. | 365/230.05 |
| 6,548,885 B2 * | 4/2003 | Ikeda et al. ................. | 257/536 |
| 6,713,815 B2 | 3/2004 | Utsunomiya et al. | |
| 6,750,555 B2 * | 6/2004 | Satomi et al. ................ | 365/154 |
| 7,282,959 B2 | 10/2007 | Sekigawa et al. | |
| 2004/0150045 A1 | 8/2004 | Nonaka et al. | |

FOREIGN PATENT DOCUMENTS

| | | |
|---|---|---|
| JP | A 8-228145 | 9/1996 |
| JP | A-10-189959 | 7/1998 |
| JP | A-11-307652 | 11/1999 |
| JP | A 2001-352077 | 12/2001 |
| JP | A 2002-185306 | 6/2002 |
| JP | A-2003-060068 | 2/2003 |
| JP | A-2004-200426 | 7/2004 |
| JP | A-2005-260607 | 9/2005 |

* cited by examiner

*Primary Examiner*—Anh Phung
*Assistant Examiner*—Toan Le
(74) *Attorney, Agent, or Firm*—Oliff & Berridge, PLC

(57) ABSTRACT

A semiconductor device comprises: a) a multiple layered substrate including a semiconductor substrate, an insulation film formed on the semiconductor substrate, and a semiconductor film, b) a first inverter having a first n-channel type MISFET and a first p-channel type MISFET connected in series each other, being formed on a first region in the multiple layered substrate; c) a second inverter having a second n-channel type MISFET and a second p-channel type MISFET connected in series each other, being formed on a second region; d) a first wiring connecting the output of the first inverter to the input of the second inverter; e) a second wiring connecting the output of the second inverter to the input of the first inverter; f) a first back gate region formed on the first region in the semiconductor substrate; g) a second back gate region formed on the second region in the semiconductor substrate; (h) a first connecting portion between the first wiring and the second back gate region; and (i) a second connecting portion between the second wiring and the first back gate region.

12 Claims, 16 Drawing Sheets

SEMICONDUCTOR DEVICE, LOGIC CIRCUIT AND ELECTRONIC EQUIPMENT

BACKGROUND OF THE INVENTION

1. Technical Field

The present invention relates to a semiconductor, in particular, a transistor formed on silicon on insulator (SOI) substrate.

2. Related Art

Forming a transistor on a SOI substrate has an advantage of low power consumption and low voltage drive because of small parasitic capacitance, comparing with a case when a transistor is formed on a bulk substrate. Further, such forming has another advantage in that high speed driving can be available and the development of it has been attracted attention.

Improving characteristics of such transistors are studied in diverse ways. For example, JPA8-228145 discloses a technology of low power consumption at the time of high-speed operation and waiting in that a body portion of a at MOSFET in a logic circuit is made be a floating state, lowering the threshold voltage of a MOSFET and a bias voltage is applied to a body portion of a MOSFET in a power source switch, raising the threshold voltage of a MOSFET.

The inventor sharply studied the improvement of characteristics of a semiconductor device formed on a SOI substrate, in particular, reducing leak current in a integrated circuit formed on a SOI substrate.

An inverter circuit (an inverter) is the most basic circuit block among integrated circuits, having a structure in that a n-channel type MISFET is connected to a p-channel type MISFET in series. In these inverters, a common gate of MOSFET becomes an input and a connecting portion between a n-channel type MOSFET and a p-channel type MOSFET becomes an output.

Further, in a SOI substrate in which multiple layers of an insulating film and a semiconductor film are deposited on a semiconductor substrate, it is important to give a fixed (control) potential not only to a body portion (a semiconductor film), but to a back gate portion (a semiconductor substrate) located next to the above portion through an insulating film, differing from a bulk substrate.

Here, in order to fix a body portion as a predetermined potential, it is necessary to install a contact portion for supplying potential on a region in which elements are formed (a semiconductor film), increasing a circuit area.

Then, the inventor studied an inverter structure in which a body portion becomes a floating state and the potential of a back gate portion is controlled.

However, when the backdate portion (a semiconductor substrate) is fixed as a ground potential (Vss), the potential difference between a source potential (Vss) and the backdate potential becomes zero in a n-channel type MISFET. But the potential difference between a source potential (Vdd) and the backdate potential becomes −Vdd in a p-channel type MISFET. Hence, the threshold value of the p-channel type MISFET moves to a depletion side and leakage current increases (see FIG. 3.) On the other hand, when the backdate portion (a semiconductor substrate) is fixed as a source potential (Vdd), the threshold value of a n-channel type MISFET moves to a depletion side and leakage current increases (see FIG. 3.)

SUMMARY

An advantage of the present invention is to improve characteristics of semiconductor device having an inverter, in particular, decrease leakage current. Further, the invention is to provide a logic circuit having superior propriety in particular, an inverter driven by low power consumption.

a multiple layered substrate including a semiconductor substrate, an insulation film formed on the semiconductor substrate, and a semiconductor film (b) a first inverter having a first n-channel type MISFET and a first p-channel type MISFET connected in series each other, being formed on a first region in the multiple layered substrate, (c) a second inverter having a second n-channel type MISFET and a second p-channel type MISFET connected in series each other, being formed on a second region, (d) a first wiring connecting the output of the first inverter to the input of the second inverter, (e) a second wiring connecting the output of the second inverter to the input of the first inverter, (f) a first back gate region formed on the first region in the semiconductor substrate, (g) a second back gate region formed on the second region in the semiconductor substrate, (h) a first connecting portion between the first wiring and the second back gate region, and (i) a second connecting portion between the second wiring and the first back gate region.

According to the above aspect, connecting the first wiring to the second back gate region (a back gate portion) and connecting the second wiring to the first back gate region can reduce leakage current. In particular, leakage current of the first and the second p-channel type MISFETs can be reduced at the time of turning them off, comparing with a case when the first and second back gate regions are not formed and the semiconductor substrate is fixed to the ground potential (Vss.) Further, leakage current of the first and the second n-channel type MISFETs can be reduced at the time of turning them off, comparing with a case when the first and second back gate regions are not formed and the semiconductor substrate is fixed to the source potential (Vdd.)

For example, the first inverter and the second inverter constitute an information memory unit in SRAM. According to the structure, leakage current of an information memory unit in SRAM can be reduced. In particular, the effect of reducing leakage current is great in SRAM since there are many information memory units having the above structure in SRAM.

The present aspect may further comprise a first data line, a second data line, a first transistor (normally n-type MISFET) connected between the first data line and the second inverter a second transistor (normally p-type MISFET) connected between the second data line and the first inverter. Further, in the present aspect, the first back gate region may not extend to the region in which the first transistor is formed and the second back gate region may not extend to the region in which the second transistor is formed. According to the structure, leakage current of an information memory unit in SRAM can be reduced. Further, data in the information memory unit can be read out to the first and second data lines via the first and second transistors. Further, the first and second back gate regions does not extend to the regions in which the first and second transistors are formed, controlling the potential in the back gate regions of the first and second transistors independently from other MISFETs by fixing the potential of the semiconductor substrate as a predetermined level.

The first and second back gate regions may be impurity regions formed in the semiconductor substrate. This structure can easily make the potential of the first back gate be that of the second back gate.

The semiconductor substrate may be p-type and the first and second back gate regions may be n-type impurity region and the semiconductor substrate may be connected to the ground potential. This structure can separate the potential of the back gate region from the potential (the ground potential) of the semiconductor substrate so log as the potential of the back gate region being larger than the ground potential, even when the ground potential is applied to the semiconductor substrate The semiconductor substrate may be n-type and the first and second back gate regions may be p-type impurity region and the semiconductor substrate may be connected to the source potential. This structure can separate the potential of the back gate region from the potential (the source potential) of the semiconductor substrate so log as the potential of the back gate region being smaller than the source potential, even when the source potential is applied to the semiconductor substrate.

The first connecting portion may include a gate wiring composed of a first n-channel type MISFET or a first p-channel type MISFET in the path of the first connecting portion and the second connecting portion may include a gate wiring composed of a second n-channel type MISFET or a second p-channel type MISFET in the path of the second connecting portion. Thus, utilizing a gate wiring located under layer as the first and the second connecting portions can down size an area of the semiconductor device.

The first and second n-channel type MISFET s and the first and second p-channel type MISFETs may be fully-depleted transitors. This structure can easily change characteristics due to back gate potential via the insulating film, reducing leak current by controlling the back gate potential.

(2) According to a second aspect of the invention, an electronic device is provided with the above mentioned semiconductor device. This structure can improve characteristics of an electronic apparatus. In particular, it can reduce consumption current. Here, "an electronic apparatus" is a general apparatus provided with the semiconductor device regarding the present invention and performing a predetermined function and not limited to a specific structure, but one of various apparatuses such as computer devices, mobile phones, personal handy phone systems, personal digital assistants, electronic note, and integrated circuit cards.

3) According to a third aspect of the invention, a logic circuit includes :a semiconductor substrate an insulating film formed on the semiconductor substrate; a semiconductor film formed on the insulating film; a multi layered substrate including; first and second inverters connected with crossing each other, formed on the multi layered substrate; first back gate portions of a first n-channel type MISFET and a first p-channel type MISFET constituting the first inverter have the same potential and are connected to the output of the second inverter; second back gate portions of a second n-channel type MISFET and a second p-channel type MISFET constituting the second inverter have the same potential and are connected to the outputs of the first inverter.

The above structure can reduce leakage current. In particular, leakage current of the first and the second p-channel type MISFET s can be reduced at the time of turning them off, comparing with a case when the first and second back gate regions are not formed and the semiconductor substrate is fixed to the ground potential (Vss.) Further, leakage current of the first and the second n-channel type MISFETs can be reduced at the time of turning them off, comparing with a case when the first and second back gate regions are not formed and the semiconductor substrate is fixed to the source potential (Vdd.)

(4) According to a fourth aspect of the invention, a logic circuit includes: a multiple layered substrate including a semiconductor substrate, an insulation film formed on the semiconductor substrate, and a semiconductor film; first and second inverters connected in series each other, formed on the multi layered substrate; first back gate portions of a first n-channel type MISFET and a first p-channel type MISFET constituting the first inverter have the same potential and are connected to the output of the second inverter; second back gate portions of a second n-channel type MISFET and a second p-channel type MISFET constituting the second inverter having the same potential and being connected to the outputs of the first inverter.

The above structure can reduce leakage current. In particular, leakage current of the first and the second p-channel type MISFETs can be reduced at the time of turning them off, comparing with a case when the first and second back gate regions are not formed and the semiconductor substrate is fixed to the ground potential (Vss.) Further, leakage current of the first and the second n-channel type MISFETs can be reduced at the time of turning them off, comparing with a case when the first and second back gate regions are not formed and the semiconductor substrate is fixed to the source potential (Vdd.)

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
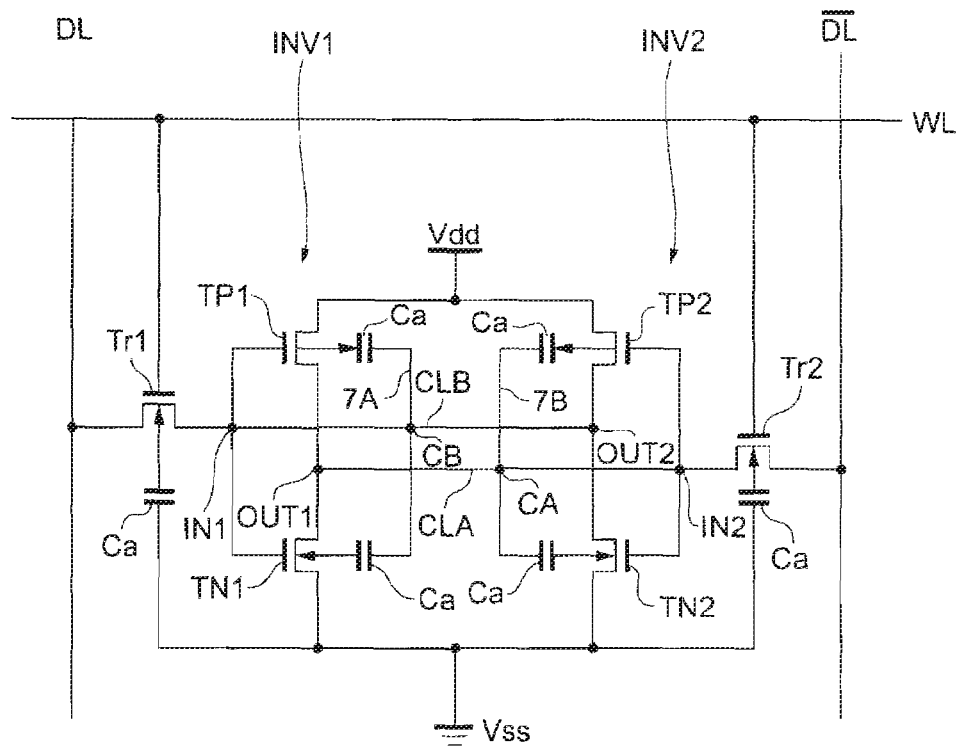
FIG. 1 is a circuit diagram showing a first embodiment of SRAM (a semiconductor device).

Embodiments of the invention will now be described in detail with reference to the accompanying drawings. Here, the same reference numerals are applied to elements showing the same function and repetitive explanation is omitted.

Embodiment 1

FIG. 1 is a circuit diagram showing a static random access memory (SRAM) of the present embodiment.

As shown in the figure, a SRAM memory cell comprises a pair of data lines(data line DL, and data line $\overline{DL}$) a pair of MISFETs Tr1 and Tr2 for transferring, p-channel type MISFETTP1 and TP2 and n-channel type MISFETN1 and TN2.

Among the above six MISFETs (transistors) constituting a memory cell, the p-channel type MISFETTP1 and the n-channel type MISFETTN1 constitute a CMOS inverter INV1 and the p-channel type MISFETTP2 and the n-channel type MISFETTN2 constitute a CMOS inverter INV2. Input and output portions (IN1,OUT1, IN2,OUT2 ) of a pair of the CMOS inverters INV1 and INV2, are connected with crossing each other. Specifically, the input portion (input terminal) IN1 is connected to the output portion (output terminal) OUT2 via a cross connecting wire CLB and the input portion (input terminal) IN2 is connected to the output portion (output terminal) OUT1 via a cross connecting wire CLA. These connections provide a flip-flop circuit memorizing one bit information.

Namely, the p-channel type MISFETTP1 and the n-channel type MISFETTN1 are connected in series between a source voltage (driving voltage H level) Vdd and a ground voltage (ground, reference voltage, L level) Vss and their connecting nodes become the output portion (a storing node) OUT1. Further, the p-channel type MISFETTP2 and the n-channel type MISFETTN2 are connected in series between the source voltage Vdd and the ground voltage Vss and their connecting nodes become the output portion (a storing node) OUT2.

Further, gate electrodes of the p-channel type MISFETTP1 and the n-channel type MISFETTN1 are connected to the output portion OUT2 and gate electrodes of the p-channel type MISFETTP2 and the n-channel type MISFETTN2 are connected to the output portion OUT1.

Further, one of input and output portions (IN1, and OUT2) of this flip flop circuit is connected to one of source and drain regions of the MISFETTr1 for transferring and another of input and output portions (IN2, and OUT1) is connected to one of source and drain regions of the MISFETTr2 for transferring. Further, another of the source and drain regions of the MISFETTr1 for transferring is connected to the data line DL and another of the source and drain regions of the MISFETTr2 for transferring is connected to the data line $\overline{DL}$. Gate electrodes of the MISFETTr1 and Tr2 for transferring are connected to the word line WL. Here, the MISFETTr1 and Tr2 for transferring are n-channel type transistors. Data can be written and read from a flip-flop circuit (information memory unit) via these the MISFETTr1 and Tr2 for transferring.

Here, the above six MISFETs are formed on the SOI substrate. Hence, these are formed in a semiconductor film in the SOI substrate in which the semiconductor film and insulation film are deposited on the semiconductor substrate. Namely, as shown in FIG. 1, there is an insulating capacitance Ca located between a body portion (a channel region and a semiconductor film) and a back gate portion (a semiconductor substrate.)

Next, specific features of a SRAM circuit in the embodiment will be explained. In the embodiment, the back gate of the p-channel type MISFETTP1 is connected to that of the n-channel type MISFETTN1 (7A), making the same potential for both back gates. These back gate portions are connected to a cross connecting line CLB via a connecting portion CB. In the embodiment, the back gate of the p-channel type MISFETTP2 is connected to that of the n-channel type MISFETTN2 (7B), making the same potential for both back gates. These back gate portions are connected to a cross connecting line CLA via a connecting portion CA. Here, the back gate portion of MISFET is defined as a semiconductor region (portion) opposing source, drain and channel regions of MISFET via a insulating film. It is desirable that the back gate may oppose only a channel region within an accuracy of manufacturing. Opposing only a channel region can exclude excessive load capacitance.

Figure 2:
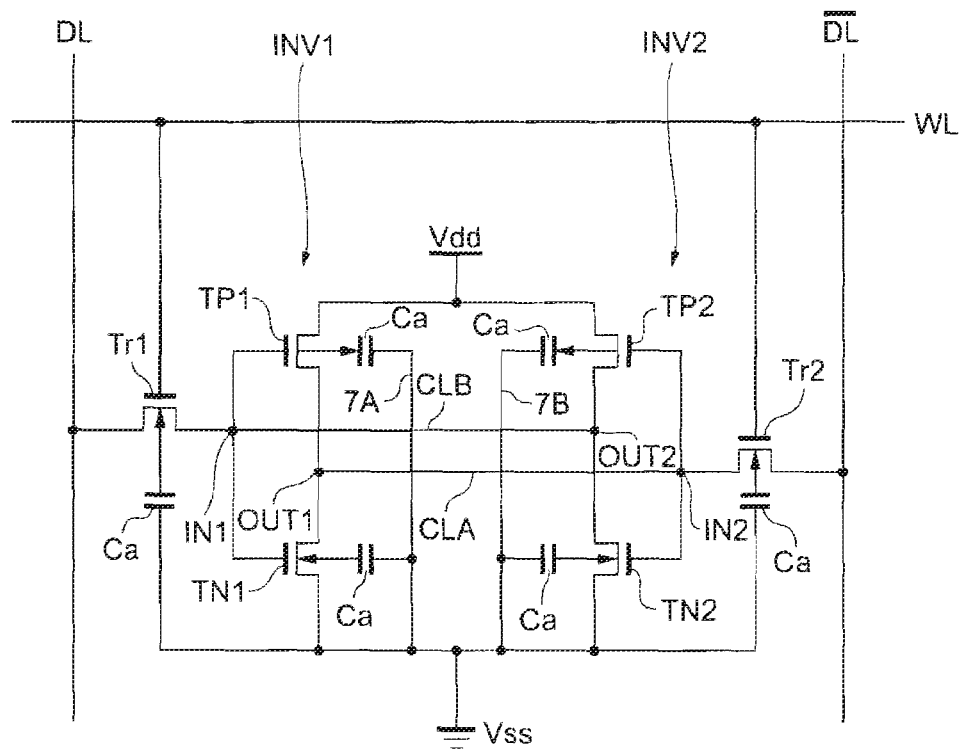
FIG. 2 is a circuit diagram of SRAM (comparison) for explaining the effect of the embodiment 1.
Figure 3:
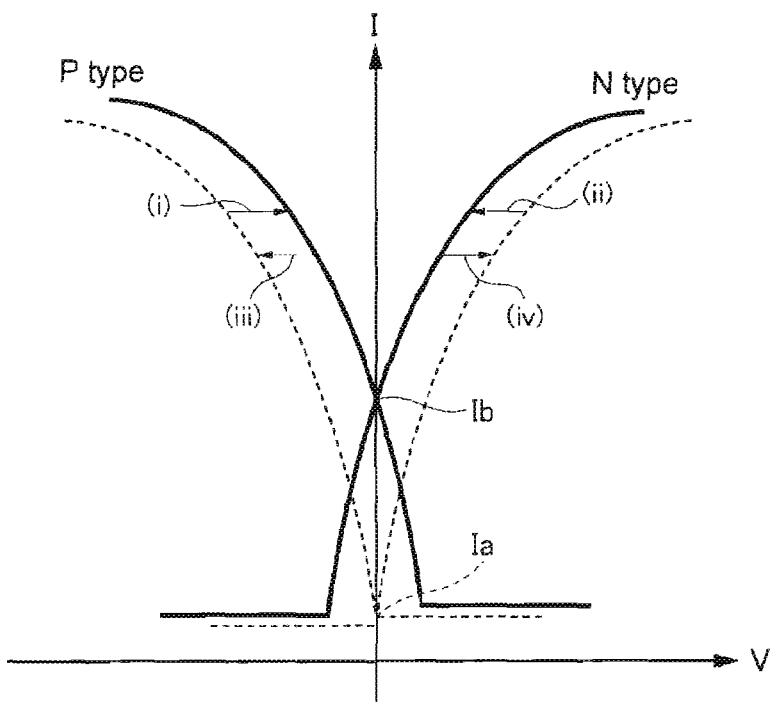
FIG. 3 is a diagram showing I-V characteristic of a SOI transistor.
Figure 4:
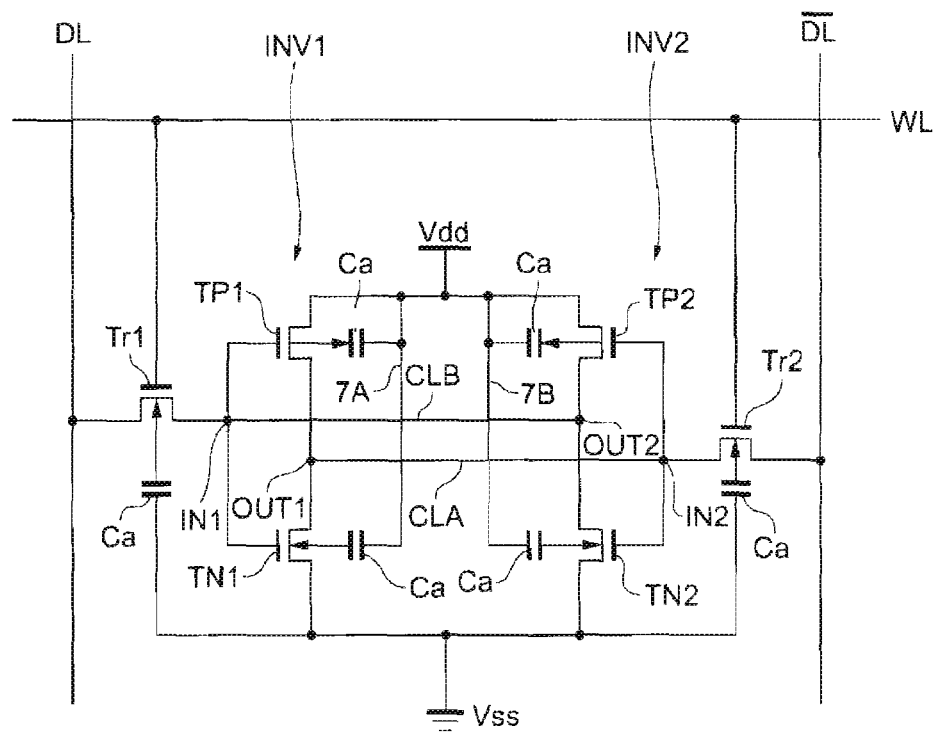
FIG. 4 is a circuit diagram of SRAM (comparison) for explaining the effect of the embodiment 1.

Accordingly, in the embodiment, the above structure can reduce leakage current. The effect of reducing leak current will be explained hereafter with referring to FIG. 2 to FIG. 4. FIG. 2 to FIG. 4 are diagrams of SRAM circuit (comparison) for explaining the effect of the invention. FIG. 3 is a diagram showing Id-Xg characteristics (transferring characteristic) about p-channel type and n-channel type fully-depleted SOI transistors.

For example, as shown in FIG. 2, it is explained a case when back gate portions of p-channel type MISFET (TP1 and TP2) and n-channel type MISFET (TN1 and TN2) are connected to the ground potential Vss.

In the circuit shown in FIG. 2, the potential difference between the source potential and the back gate potential becomes zero in n-channel type MISFET (TN1 and TN2.) On the other hand, the potential difference between the source potential and the back gate potential becomes −Vdd in p-channel type MISFET (TP1 and TP2.) As indicated by an arrow mark (i) in FIG. 3, this circuit results in that the I-V characteristic of MISFET (TP1 and TP2) moves to the depletion side. Then, even when p-channel type MISFET (TP1 and TP2) is an off state, the current Ib flows and leakage current increases.

On the other hand, in the embodiment, when the gate potentials of p-channel type MISFETTP1 (or TP2) and n-channel type MISFETTN1 (or TN2) are H level, the output OUT1 of them are L level. This output is input to the input IN2 of the inverter INV2 and the output OUT2 of INV2 becomes H level. This output OUT2 gives H level to the back gate potential of INV1 via the connecting portion CB. The back gate potential H level promotes reduction of the leakage current (IA←Ib) of the p-channel type indicated as an allow (iii). In this case, the load of INV2 is slightly increased by Cax2. But, it is enough to increase driving capability of n-channel type MISFET (TN2) by such amount.

On the other hand, as shown in FIG. 4, it is explained a case when back gate portions of p-channel type MISFET (TP1 and TP2) and n-channel type MISFET (TN1 and TN2) are connected to the ground potential Vdd.

In such case, the potential difference between the source potential and the back gate potential becomes zero in p-channel type MISFET (TP1 and TP2.) On the other hand, the potential difference between the source potential and the back gate potential becomes Vdd in n-channel type MISFET (TN1 and TN2.)

As indicated by an arrow mark (ii) in FIG. 3, this circuit results in that the I-V characteristic of MISFET (TN1 and TN2) moves to the depletion side. Then, even when n-channel type MISFET (TN1 and TN2.) is an off state, the current Ib flows and leakage current increases.

On the other hand, in the embodiment, when the gate potentials of p-channel type MISFETTP1 (or TP2) and n-channel type MISFETTN1 (or TN2) are L level, the output OUT1 of them are H level. This output is input to the input IN2 of the inverter INV2 and the output OUT2 of INV2 becomes L level. This output OUT2 gives L level to the back gate potential of INV1 via the connecting portion CB. The back gate potential L level promotes reduction of the leakage current (Ia←Ib) of the p-channel type indicated as an allow (iv). In this case, it is enough that driving capability of p-channel type MISFET (TP2) is enhanced by necessary amount.

As described above, the embodiment utilizes complementary output of the inverters INV1 and INV2 and controls the back gate potential of MISFET which is turned off, enabling to reduce leakage current. Specifically, both inverters are connected so that the back gates of them become the ground potential (Vss) when n-channel type MISFET is turned off and the back gates of them become the source potential (Vdd) when p-channel type MISFET is turned off. Namely, the back gate potential constraining leakage current is controlled to be applied automatically and dynamically, reducing leakage current. In particular, the effect of reducing leakage current is great in SRAM since there are many information memory units having the above structure in SRAM.

Next, the structure of SRAM of the embodiment and a method of manufacturing it will be explained, with referring to FIG. 5 to FIG. 20. FIG. 5 to FIG. 20 are a plane view or a sectional view showing a method of manufacturing SRMA of the embodiment. The sectional view corresponds to A-A cross section or B-B' cross section in the plane view. Here, the plane view shows a region of a single memory cell.

Figure 6:
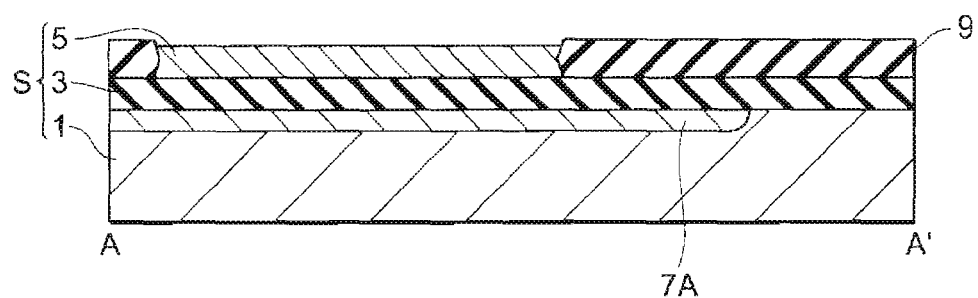
FIG. 6 is a sectional diagram showing a process for manufacturing SRAM of the first embodiment.
Figure 7:
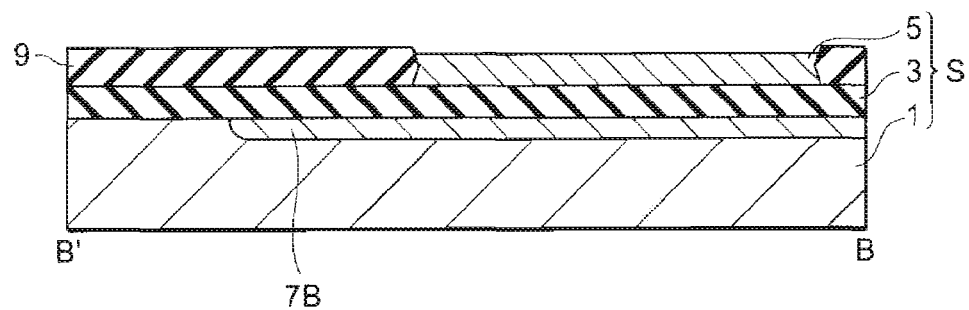
FIG. 7 is a sectional diagram showing a process for manufacturing SRAM of the first embodiment.

First, a SOI substrate S is prepared. As shown in FIG. 6 and FIG. 7, the SOI substrate is a multi-layered substrate in which an insulating film formed on a semiconductor substrate and a semiconductor film, formed on the insulating film are deposited on the semiconductor substrate. Here, as an example, the SOI substrate comprises a p-type mono crystalline silicon substrate I, an embedded oxide layer(an insulating film, a BOX layer) 3 and a mono crystalline silicon film 5. The embedded oxide layer 3 is an oxide silicon film for example.

The SOI substrate is fabricated by a method of separation by implanted oxygen (SIMOX) or a bonding method. The SIMOX is a method in which the embedded oxide layer 3 is formed by ion-implanting high concentrated oxygen into a mono crystalline silicon substrate. The bonding method is the following. Namely, one mono crystalline substrate of which surface is covered by an oxygen film is bonded to another mono crystalline substrate by thermal adhesion and the like, then, another mono crystalline substrate is polished.

Figure 5:
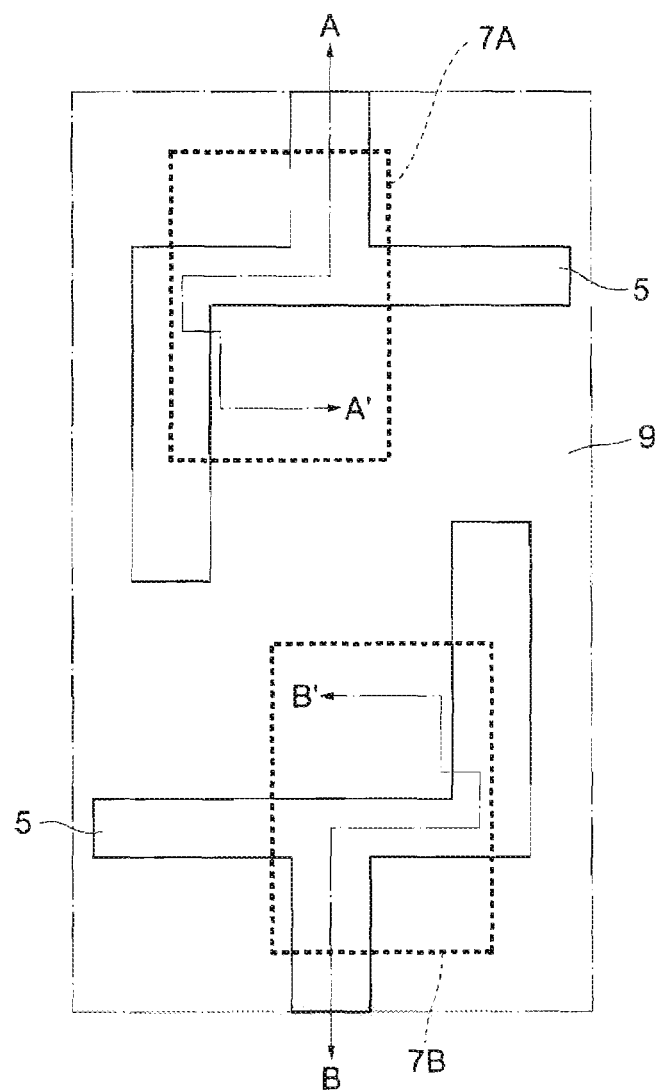
FIG. 5 is a plane diagram showing a process for manufacturing SRAM of the first embodiment.

Next, as shown in FIG. 5 to FIG. 7, n-type impurity such as phosphor (P) or arsenide (As) is ion-implanted into the silicon substrate 1 of the SOI substrate and thermally diffused. This process forms n-type impurity regions (impurity implanted region, impurity diffused region, diffused layer, well, back gate portion) 7A and 7B. Here, instead of the above thermal diffusion, impurity may be diffused by the following thermal process (such as thermal oxidization.) These impurity regions 7A and 7B correspond to a region for forming MISFET constituting inverters INV1 and INV2 and a region for forming a contact hole (contact portion) CH1w. Details will be explained later. In other word, MISFETs constituting inverters INV1 and INV2 and a contact hole (contact portion) CH1w are formed on the upper area of impurity regions 7A and 7B (areas surrounded by dot lines.) From other point of view, impurity regions 7A and 7B are placed (formed) so as to include a channel region of MISFET constituting inverters (INV1 and INV2) and a region for forming the contact hole (contact portion) CH1w. These impurity regions make back gate portions of MISFETs constituting inverters connected each other. Namely, these back gate portions have the same potential.

Next, a pad insulating film such as a thin oxide silicon film is formed on the mono crystalline silicon film 5 by thermal oxidation. Further, a nitride silicon film is formed on the pad insulating film by chemical vapor deposition (CVD.) Then, a photo resist film is formed on the nitride silicon film and the photo resist film is left on the region for forming elements by exposing with light and developing (photography.) Next, the nitride silicon film is etched with making the photo resist film as a mask, leaving the nitride film in the region for forming elements. Further, the photo resist film is removed by ashing for example. Here, these processes of forming the photo resist film, exposure, development, etching and removing the photo resist film is called as "patterning".

Next, the silicon film 5 (the SOI substrate S) is thermally oxidized (LOCOS oxidization) with making the nitride film on the region for forming elements as a mask, forming a separation insulating film 9. Further, the nitride silicon film and the pad insulating film are removed by etching. As a result, the silicon film 5 in the region for forming elements is exposed and other regions (element isolating regions) are covered by the separation insulating film 9. Here, as a method of separating elements, local oxidation of silicon (LOCOS) is used, but trench separation may be used instead.

Figure 8:
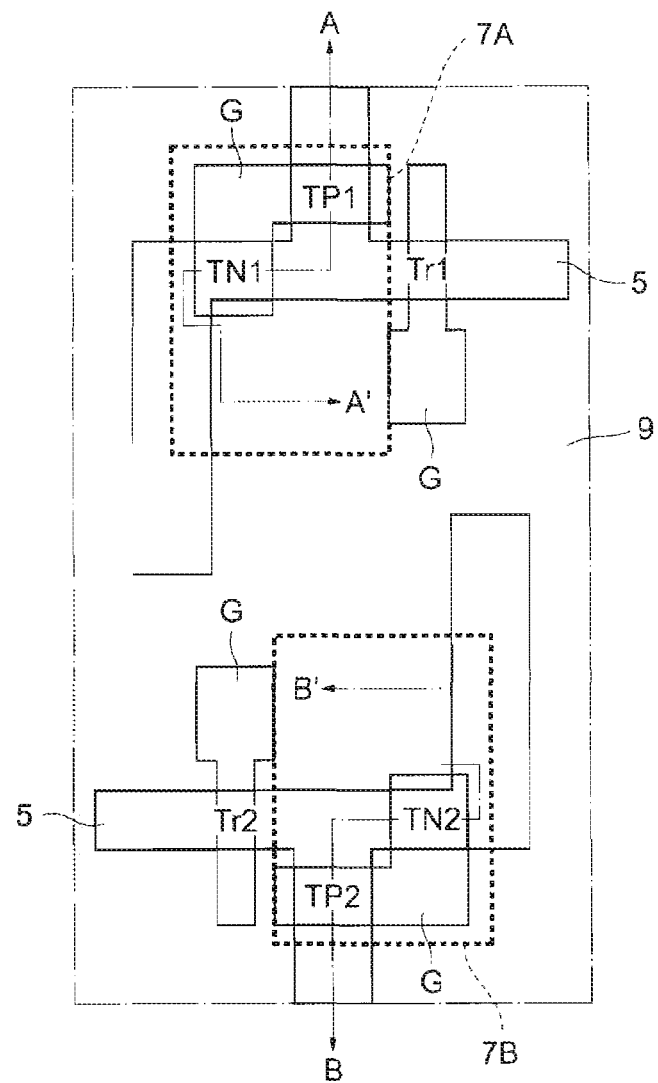
FIG. 8 is a plane diagram showing a process for manufacturing SRAM of the first embodiment.
Figure 9:
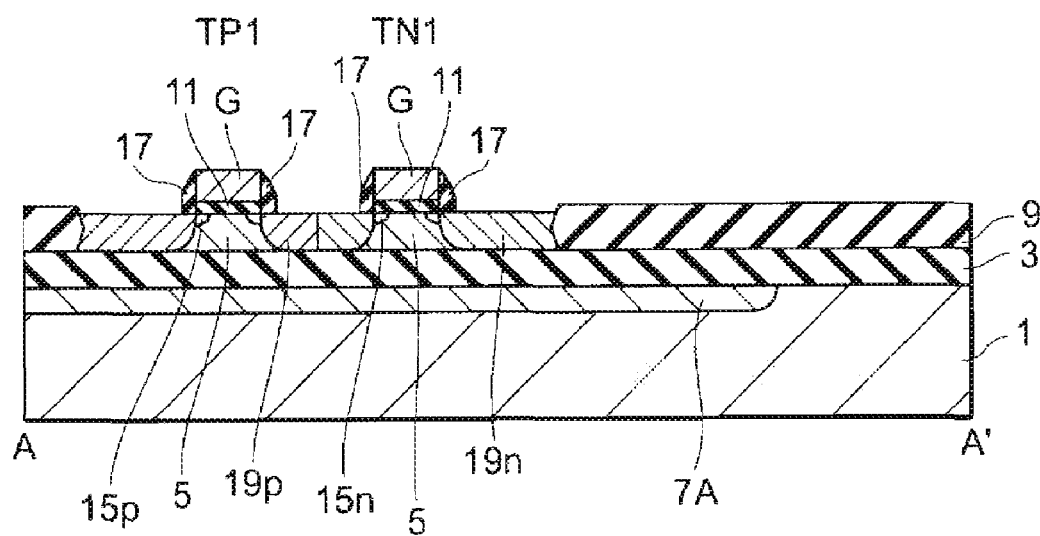
FIG. 9 is a sectional diagram showing a process for manufacturing SRAM of the first embodiment.
Figure 10:
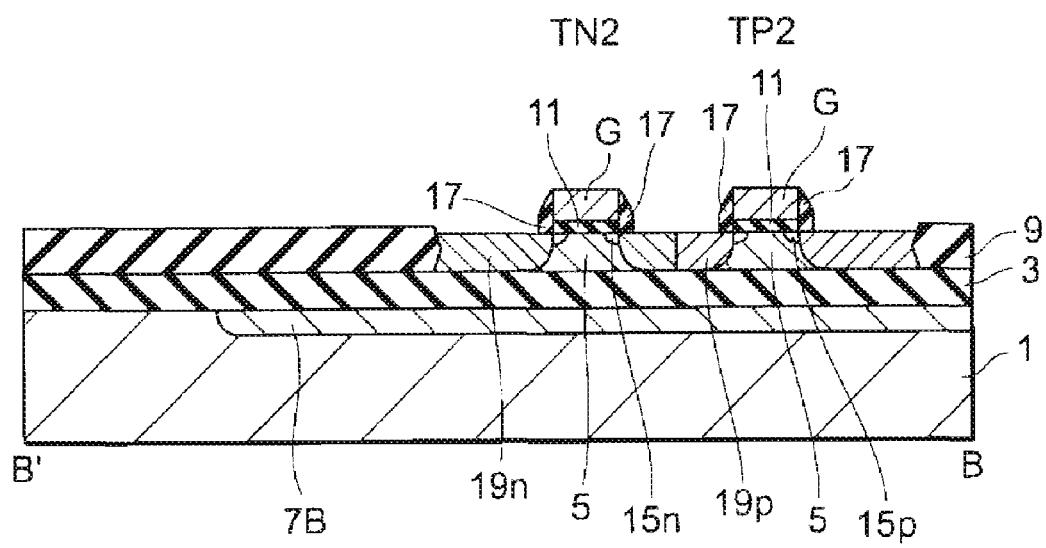
FIG. 10 is a sectional diagram showing a process for manufacturing SRAM of the first embodiment.

Next, as shown in FIG. 8 to FIG. 10, impurities are doped so as to control the threshold of n-channel type and p-channel type, a gate electrode G for MISFET is formed via a gate insulating film 11.

First, an insulating film such as an oxide silicon film is formed on the surface of the SOI substrate (the semiconductor substrate 5) S. The oxide silicon film is formed by thermally oxidizing the surface of the semiconductor substrate 5, for example and becomes the gate insulating film 11 for each MISFET. Otherwise, silicon oxynitride film may be formed by an oxynitride method or a high k insulating film may be formed by atomic layer deposition (ALD.)

Next, a conductive film such as a polycrystalline silicon film is formed on the gate insulating film by CVD and is patterned so that the gate electrode G is formed. As a material for the gate electrode, a metal film such as aluminum, and a metal compound film such as titan nitride (TiN), tantalum nitride (TaN) may be used instead of polycrystalline silicon.

FIG. 8 shows a layout of the gate electrode G for each MISFET. For example, gate electrodes G for p-channel type MISFETTP1 and n-channel type MISFETTN1 are a series of a pattern. Further, gate electrodes G for p-channel type MISFETTP2 and n-channel type MISFETTN2 are also a series of a pattern. Here, the layout of each MISFET is not limited to the one shown in the figure.

Next, n-type impurity (Phosphor or Arsenide for example) is implanted into the silicon film 5 located at both sides of gate electrodes G (TN1,TN2,Tr1,Tr2) with making gate electrodes G and photo resist film (not shown) as a mask, forming an n-type semiconductor region 15n. Next, p-type impurity (Boron for example) is implanted into the silicon film 5 located at the both sides of gate electrodes G (PN1, PN2) with making gate electrodes G and photo resist film (not shown) as a mask, forming an p-type semiconductor region 15p. These regions become a low-density impurity region (LDD region) described later.

Next, an insulating film such as a silicon nitride film is formed on the SOI substrate by CVD method and etched anisotropically, forming a sidewall film 17 on both sides of the gate electrode G.

Next, n-type impurity (Phosphor or Arsenide for example) is implanted into the silicon film 5 located at both sides of gate electrodes G(TN1,TN2,Tr1,Tr2) with making the sidewall film 17, gate electrodes G and a photo resist film (not shown) as a mask, forming an $n^+$-type semiconductor region 19n. Next, p-type impurity (Boron for example) is implanted into the silicon film 5 located at the both sides of gate electrodes G (PN1, PN2) with making the sidewall film 17, gate electrodes G and a photo resist film (not shown) as a mask, forming an $p^+$-type semiconductor region 19p.

Next, impurity ions in each region (15n, 15p, 19n, and 19p) are activated by thermal processing. These processes form a lightly doped drain (LDD) structure comprising low-density impurity regions (15n, 15p) and high-density impurity regions (19n, 19p) in the source and drain region of each MISFET.

Here, each MISFET is a fully-depleted type MISFET. A fully-depleted type is an element in which the silicon film 5 in the channel region is completely depleted. Therefore, the depth and the impurity density in the source and drain regions are set and driving voltage for applying gate electrodes is determined so as to deplete the entire silicon film 5 in the channel region. Here, instead of a fully-depleted type, a type which has neutral regions in the channel is called as "a partially-depleted type." A fully-depleted type enhances low power consumption and high speed of MISFET and controllability of back gate electrodes.

Figure 11:
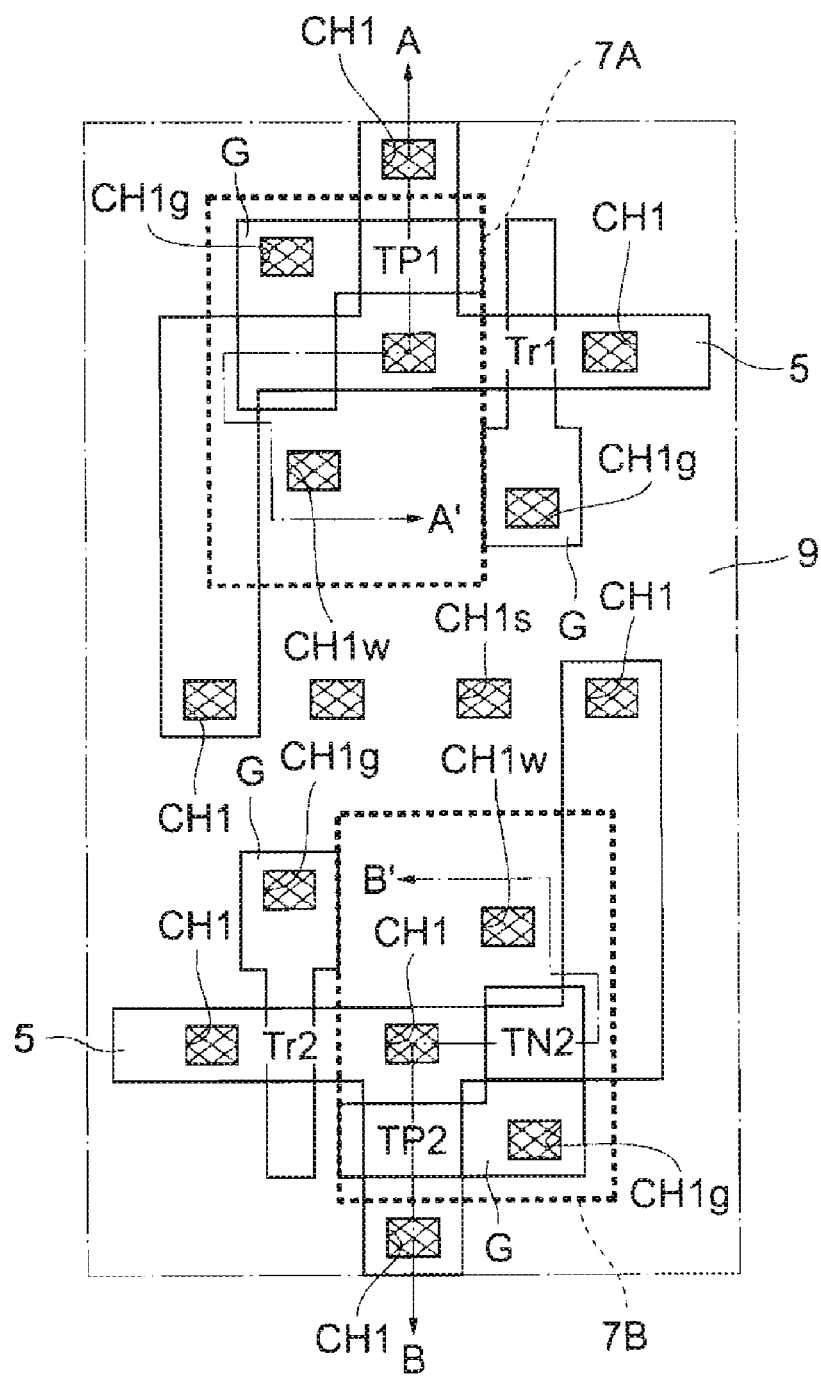
FIG. 11 is a plane diagram showing a process for manufacturing SRAM of the first embodiment.
Figure 12:
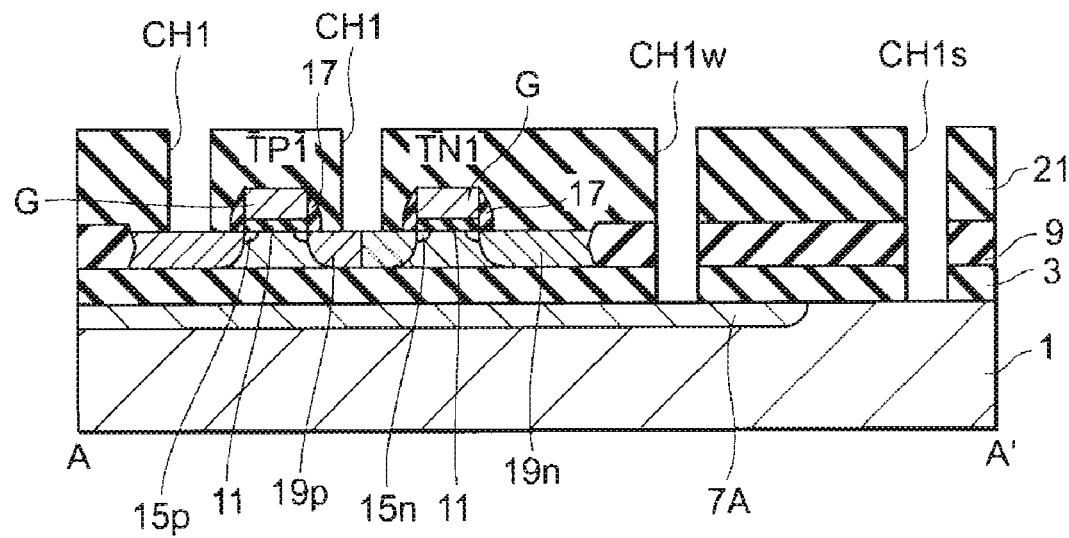
FIG. 12 is a sectional diagram showing a process for manufacturing SRAM of the first embodiment.
Figure 13:
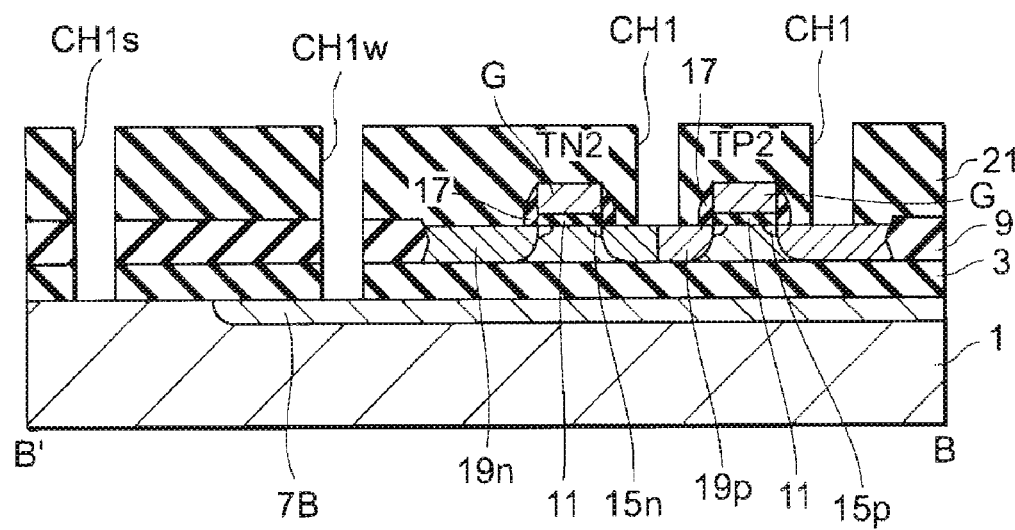
FIG. 13 is a sectional diagram showing a process for manufacturing SRAM of the first embodiment.

Next, as shown in FIG. 11 to FIG. 13, an interlayer insulation layer 21 such as a silicon oxide film is formed on the gate electrode by CVD. Further, the interlayer insulation layer 21 is patterned, forming a contact hole CH1 on the $n^+$-type semiconductor region 19n and the $p^+$-type semiconductor region 19p. In this case, a contact hole Ch1g is also formed on the gate electrode G of each MISFET. Further, a contact hole CH1w is also formed on the impurity regions (7A and 7B.) Via this contact hole CH1w, cross connecting wirings (CLA and CLB) are connected to impurity regions (7A and 7B.) Further, a contact hole CH1s is also formed on the semiconductor substrate 1. Via this contact hole CH1s, a ground wiring Vss is connected to the semiconductor substrate 1. Namely, the ground potential Vss is applied to the semiconductor substrate 1. FIG. 11 shows a layout of each of contact holes CH1 and others.

Figure 14:
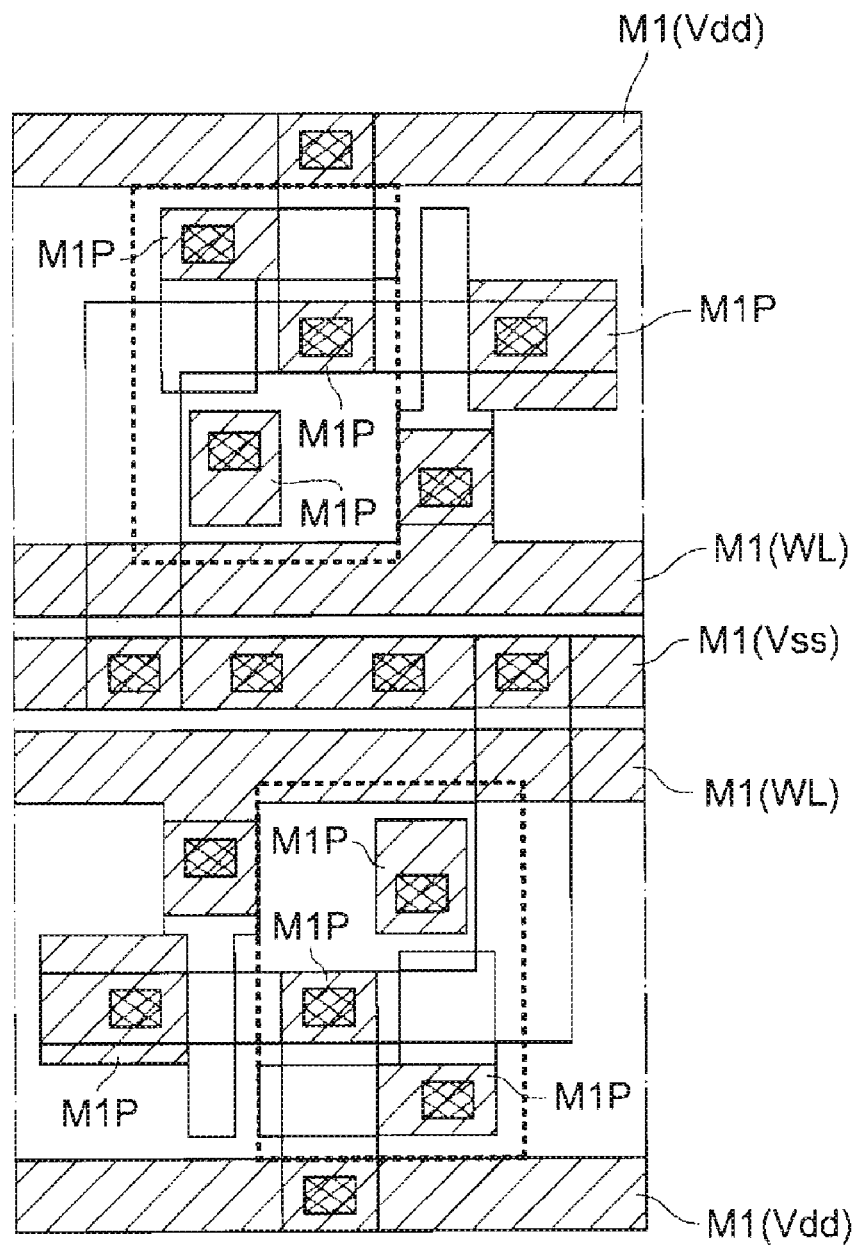
FIG. 14 is a plane diagram showing a process for manufacturing SRAM of the first embodiment.
Figure 15:
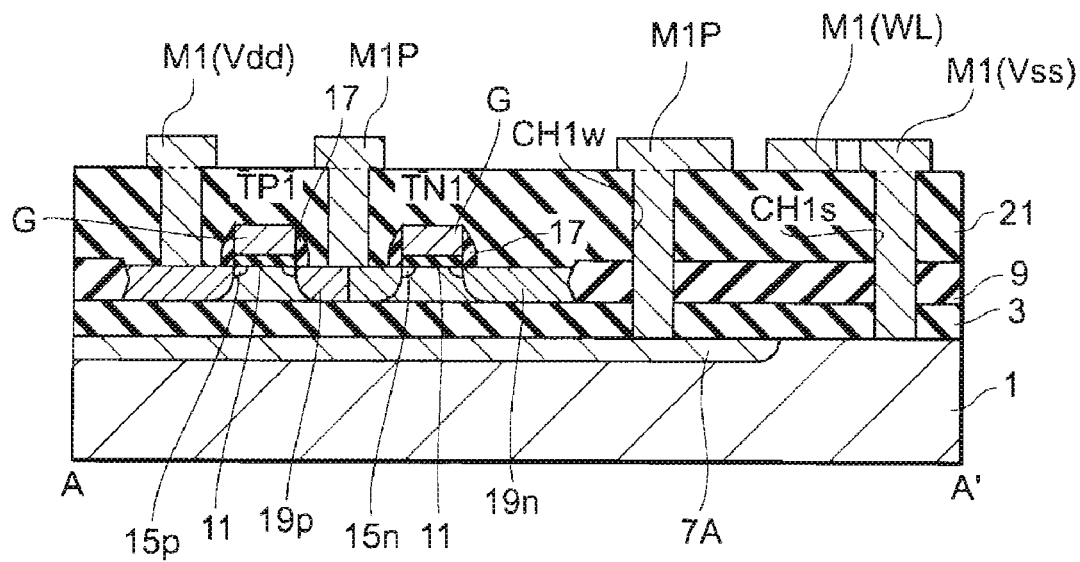
FIG. 15 is a sectional diagram showing a process for manufacturing SRAM of the first embodiment.
Figure 16:
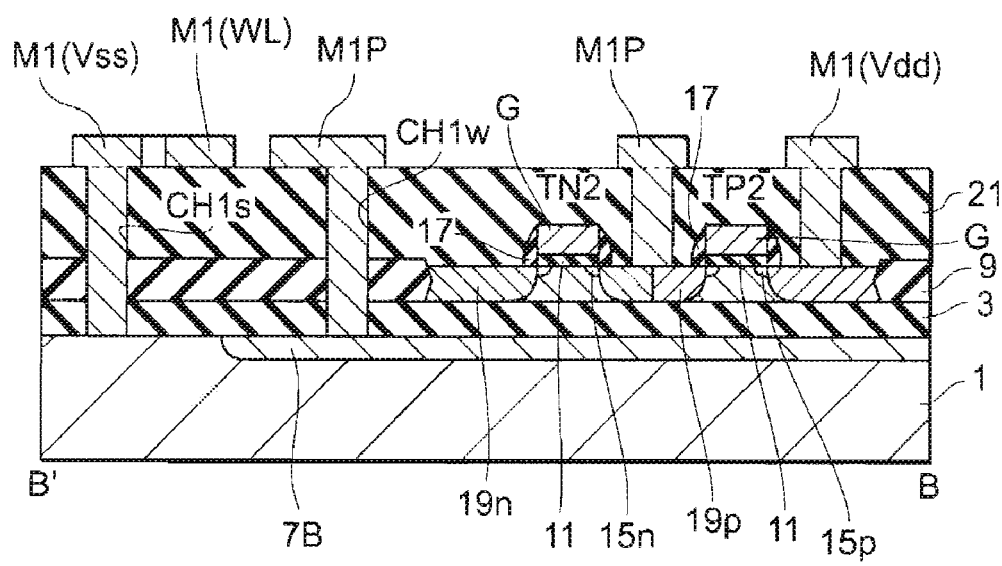
FIG. 16 is a sectional diagram showing a process for manufacturing SRAM of the first embodiment.
Figure 17:
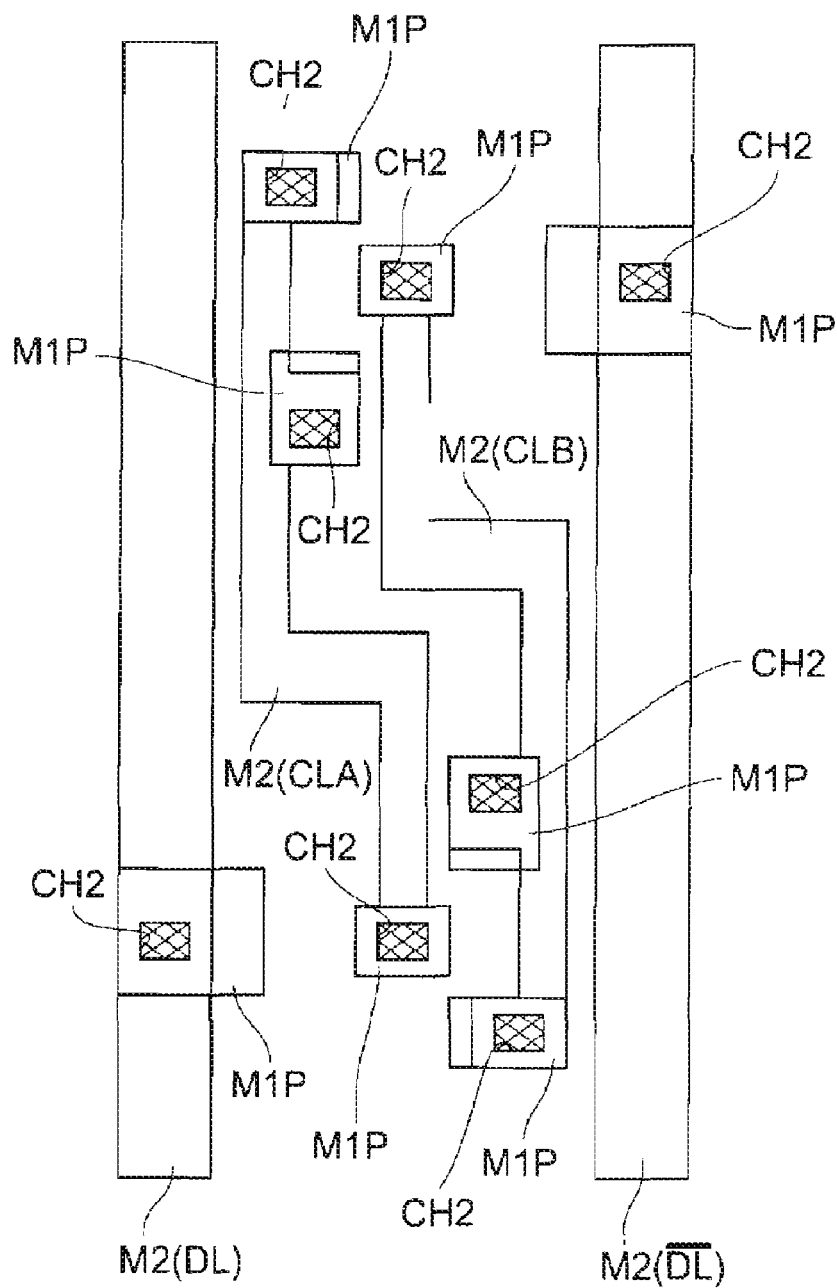
FIG. 17 is a plane diagram showing a process for manufacturing SRAM of the first embodiment.

Next, as shown in FIGS. 14 to 15, a conductive film such as aluminum is formed on the interlayer insulating film 21 including the inside of the contact hole CH1 by sputtering. Further, the aluminum film is patterned so that the contact portion and the first wiring M1 are formed. As the first wiring M1, the ground wiring Vss, the source potential wiring Vdd and word lines WL are formed for example. Further, the second wiring M2 and connecting pattern M1p are formed by using the layer of the first wiring M1. FIG. 14 shows a layout of these wirings.

Figure 20:
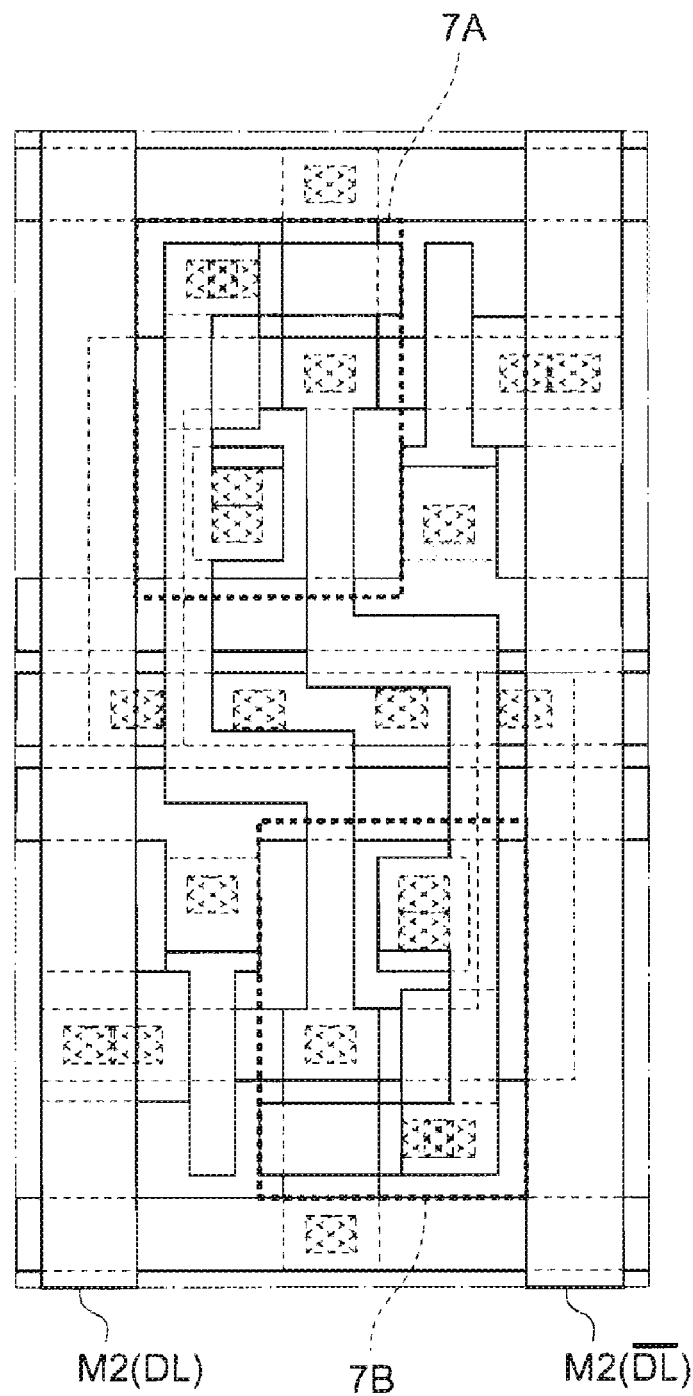
FIG. 20 is a plane diagram showing a process for manufacturing SRAM of the first embodiment.

Next, as shown in FIG. 11 to FIG. 13, an interlayer insulation layer 23 such as a silicon oxide film is formed on the first layer wiring M1 by CVD. Further, a contact hole CH2 is formed on a connecting pattern M1p by patterning the interlayer insulating film 21. Then, a conductive film such as aluminum film is formed on the interlayer insulating film 23 including the contact hole CH2. Further, the aluminum film is patterned so that the contact portion and the second wiring M2 are formed. As the second layer wiring M2, data lines (DL, $\overline{DL}$), cross connecting wirings (CLA, CLB) are formed for example. Here, in FIG. 17, the relationship among the connecting pattern M1p, the contact hole CH2 and the second interlayer wiring M2 are shown for easier understanding. FIG. 20 is a plane view for illustrating all patterns as a reference.

The above explained processes complete a SRAM memory cell comprising six MISFETs. Here, SRAM of the present embodiment is not limited to the above layout, but may be changeable appropriately within the range of the essence of the embodiment.

Accordingly, in the embodiment, the cross connecting wirings CLA and CLB are connected to the impurity regions (back gate portion, back gate region) 7A, 7B via the contact hole (contact hole portion) CH1w, connecting pattern M1p and the contact hole (contact portion) CH2. These connection portions correspond CA and CB in FIG. 1. Accordingly, the embodiment can attain the circuit shown in FIG. 1 and reduce leakage current as explained referring to FIG. 2 to FIG. 4. Further, the embodiment makes back gate portions of MISFET constituting an inverter have the same potential (connected) by using impurity regions 7A and 7B, attaining the circuit shown in FIG. 1 with a simple structure and a simple method.

Figure 18:
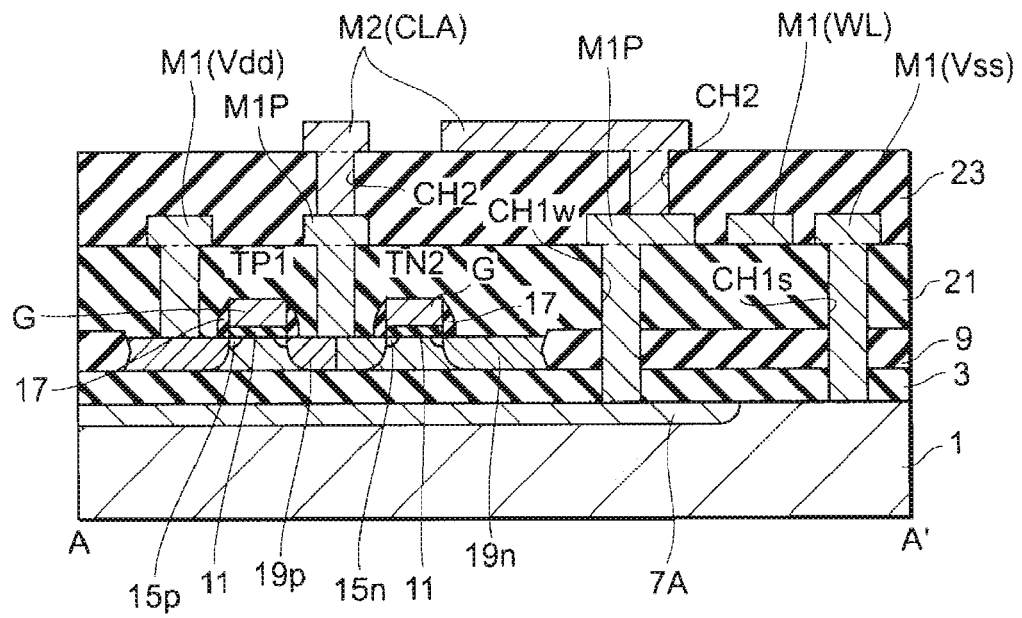
FIG. 18 is a sectional diagram showing a process for manufacturing SRAM of the first embodiment.
Figure 19:
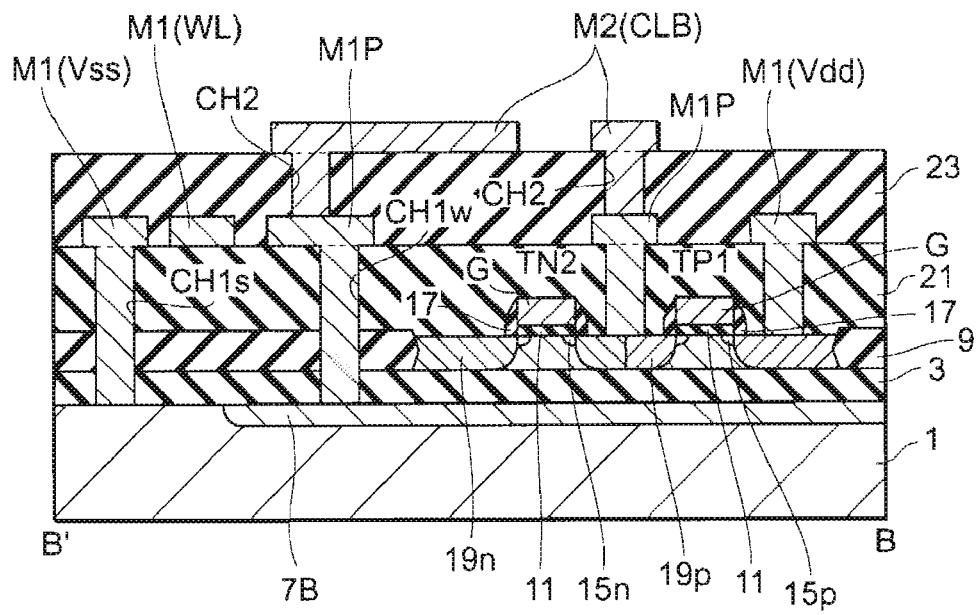
FIG. 19 is a sectional diagram showing a process for manufacturing SRAM of the first embodiment.

Further, in the embodiment, back gate portions of MISFETs constituting an inverter are connected with impurity regions 7A and 7B, separating these regions from the substrate potential. In other word, the potential of impurity regions 7A and 7B can be controlled independently from the substrate potential. Therefore, even when the p-type silicon substrate 1 is fixed to the ground potential Vss as shown in FIG. 18 and FIG. 19 for example, n-typed impurity regions 7A and 7B become an inversed bias state, reducing leakage current among them. Here, the p-type substrate was explained as an example, but impurity regions 7A and 7B may be p-type when a n-type substrate is fixed to the source potential Vdd.

Further, in the embodiment, the impurity regions 7A and 7B are not extended to the back gate portions of MISFET Tr1 and Tr2 for transferring (see FIG. 8). Hence, back gate portions of these MISFETs can be controlled independently from impurity regions 7A and 7B. Further, back gate portions of these MISFETs can be fixed to the ground potential Vss by using the silicon substrate 1. As the result, leakage current of these MISFETs can be reduced.

Embodiment 2

In the embodiment 1, impurity regions 7A and 7B are connected to the second layer wiring M2 via contact portions. But in an embodiment 2, impurity regions 7A and 7B are connected to gate the electrode G.

Here, the same structures and method of manufacturing which were explained in the embodiment 1 are omitted and only details, which are different from the embodiment 1, will be explained. FIG. 21 to FIG. 24 are plane views or sectional views showing a method of manufacturing SRMA of the embodiment. The cross section corresponds to C-C' line in the plane view. Here, the plane view shows a region of a single memory cell.

Figure 21:
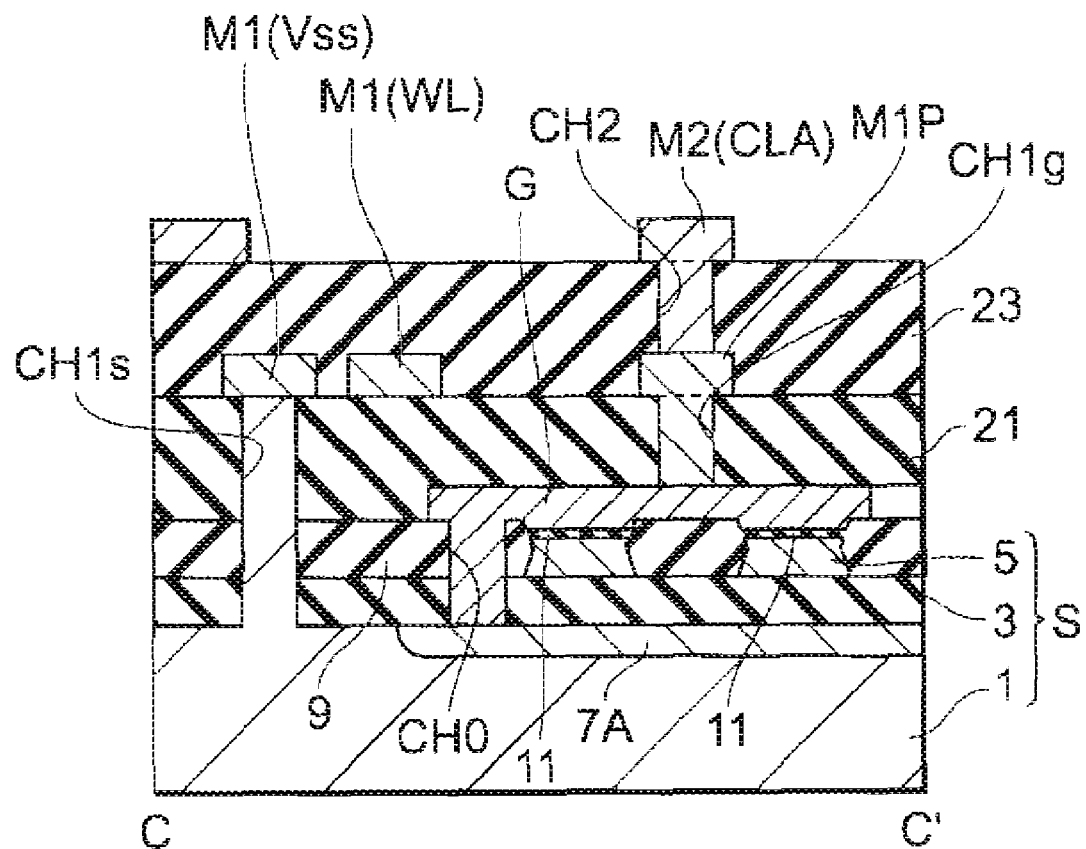
FIG. 21 is a sectional diagram showing a process for manufacturing SRAM of a second embodiment.

First, as shown in FIG. 21, the SOI substrate is prepared and n-type impurity regions 7A and 7B are formed as the same way in the embodiment 1. Next, the separation-insulating layer 9 is formed and the silicon film 5 for forming elements is exposed. Then the gate insulating film 11 is formed.

Next, in the embodiment, a contact hole CH0 is formed on the impurity regions 7A and 7B by patterning the embedded oxide film 3, the separation insulating film 9 and the gate insulating film 11.

Figure 22:
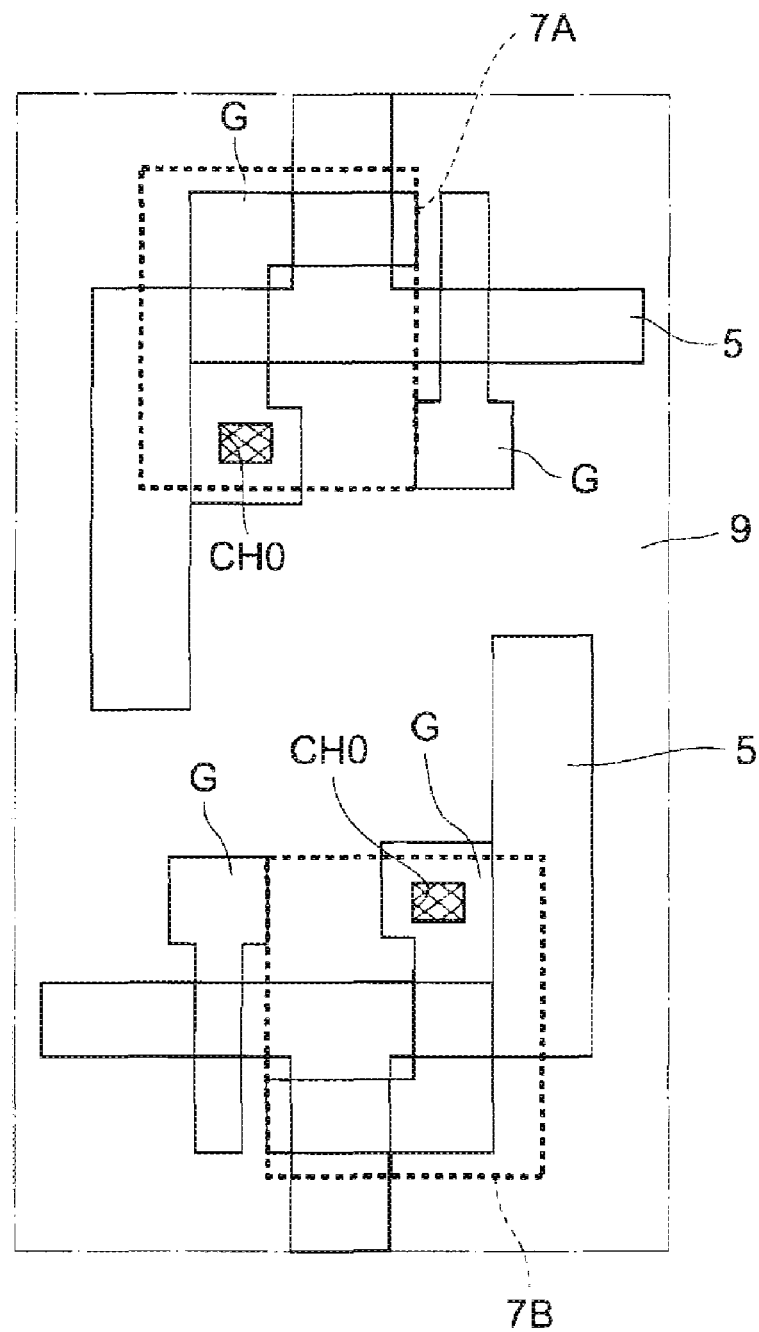
FIG. 22 is a plane diagram showing a process for manufacturing SRAM of the second embodiment.

Further, the gate electrode G is formed as the same in the embodiment 1. But, in this case, a conductive film is formed on the SOI substrate S including the contact hole CH0 and patterned. FIG. 22 shows a layout of the gate electrode G for each MISFET. Namely, the gate electrode G commonly used for MISFETs constituting an inverter is extended to the contact hole CH0 and connected to the impurity regions 7A and 7B.

Figure 23:
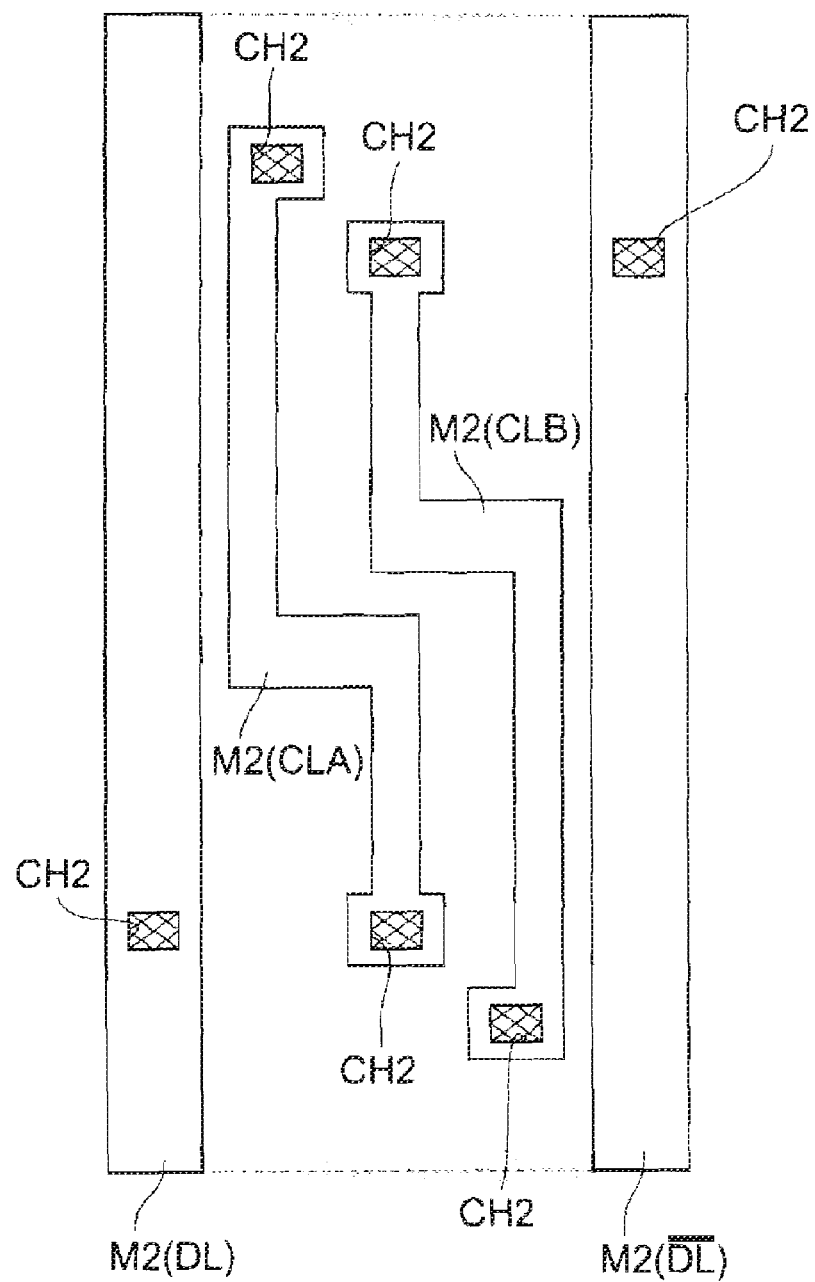
FIG. 23 is a plane diagram showing a process for manufacturing SRAM of the second embodiment.
Figure 24:
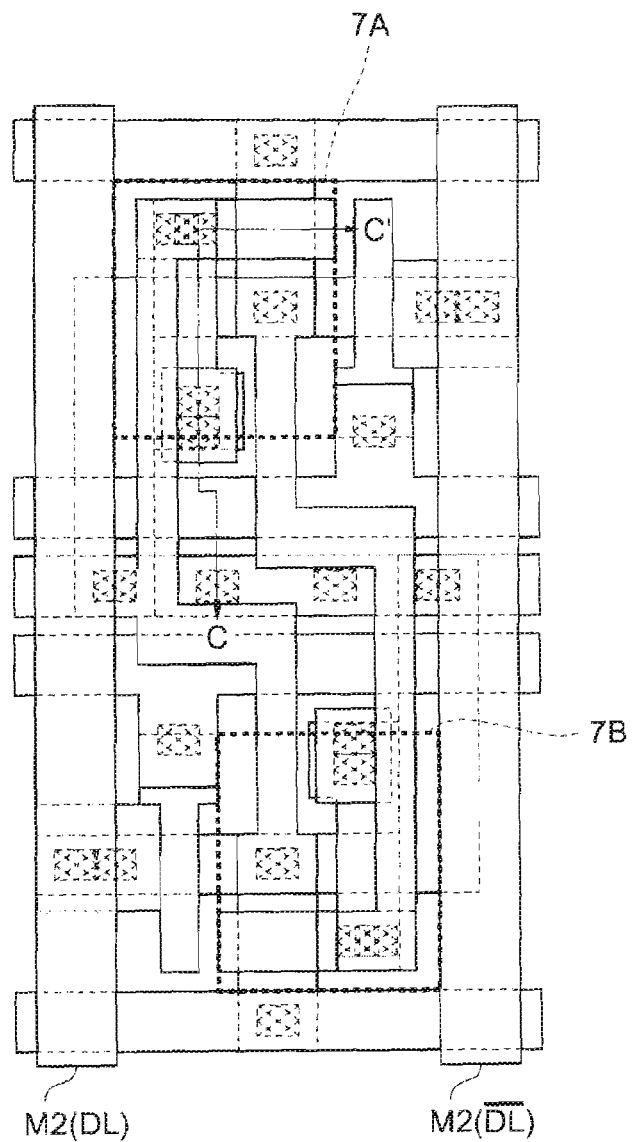
FIG. 24 is a plane diagram showing a process for manufacturing SEAM of the second embodiment.

Next, as the same in the embodiment 1, low-density impurity regions (15n and 15p), a sidewall film 17 and high-density impurity regions (19n and 19p) are formed. Here, these regions do not appear the C-C' cross section. Next, as the same in the embodiment 1, the interlayer insulating film 21, the contact portion and the first interlayer wiring M1 are formed. Then, the interlayer insulating film 23, the contact portion and the second interlayer wiring M2 are formed on the first interlayer wiring M1. In this case, the lay out of the second interlayer wiring M2 are shown in FIG. 23. FIG. 24 is a plane view for illustrating all patterns as a reference.

These above explained processes complete a SRAM memory cell comprising six MISFETs. Here, SRAM of the present embodiment is not limited to the above layout, but may be changeable appropriately within the range of the essence of the embodiment.

Thus, in the embodiment, cross connecting wirings (CLA and CLB) are connected to impurity regions (back gate portions) 7A and 7B via the gate electrode G. In other word, the gate electrode (gate wiring) of MISFETs constituting an inverter is located between cross connecting wirings CLA and CLB and impurity regions (back gate portions) 7A and 7B. Here, the gate electrode (gate wiring) of MISFETs constituting an inverter is connected to cross-connecting wirings CLA and CLB, having the same structure of the embodiment 1 as a circuit.

Accordingly, the embodiment can also attain the circuit shown in FIG. 1 and reduce leakage current as explained referring to FIG. 2 to Fog.4. Further, advantages explained in the embodiment 1 are also indicated in the embodiment.

Further, in the embodiment, impurity regions 7A and 7B are connected together by utilizing the gate electrode G, a layer that is lower than a layer in the embodiment 1. This structure can reduce the numbers of contact portions, which are necessary for connecting the cross connecting wiring (CLA and CLB) to impurity regions 7A and 7B. Therefore, the above structure increases versatility of a layout and downsizes an area of a SRAM memory cell. Namely, if numbers of contact portions are increased, it is necessary to enlarge the spacing (adjusting margin) between one contact portion and another portion or for avoiding electrical short circuit with other wirings. In such case, an area may be increased. However, according to the embodiment, downsizing an area can be attained described above.

Here, in the embodiments 1 and 2, MISFETs of fully-depleted type were explained. But the structure in these embodiments can also reduce leakage current even if the transistors are other types of transistor, namely partially-depleted type or intermediate type of fully- and partially-depleted. Because the depletion layer of these other types of transistor is not controllable and it may reach buried oxide layer (that is fully-depletion) in case of high voltage operation mode.

Figure 25:
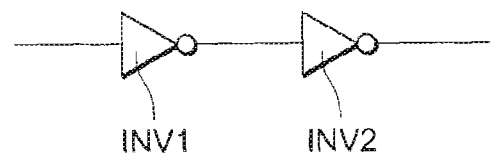
FIG. 25 is a circuit diagram for explaining other logic circuit of the invention.

Further, in the embodiments 1 and 2, SRAM was explained. The invention is not limited to this, but applied to other logic circuits (semiconductor devices) including two inverters outputting complementary signals. FIG. 25 is a circuit diagram for explaining other logic circuit of the invention. Namely, for example, in a circuit having two inverters connected in series, the back gate portions of MISFETs constituting one inverter (INV1) have the same potential and are connected to the output portion of other inverter (INV2.) Otherwise, the back gate portions of MISFETs constituting other inverter (INV2) have the same potential and are connected to the output portion of one inverter (INV1.) A logic circuit having these two inverters is a latch circuit or a delay circuit.

Further, the invention can be widely applied to a semiconductor device having such circuits and electronic devices having them. Such application can reduce power consumption of semiconductor devices and electronic devices. In particular, the invention can be well applied to small electronic devices and mobile type devices.

Examples and applications in the embodiment of the present invention can be combined appropriately for intended purposes or modified or improved so that the invention is not limited to the above-described embodiments.

The entire disclosure of Japanese Patent Application No. 2006-311734, filed Nov. 17, 2006 is expressly incorporated by reference herein.

What is claimed is:

1. A semiconductor device comprising:
   a) a multiple layered substrate including a semiconductor substrate, an insulation film formed on the semiconductor substrate, and a semiconductor film;
   b) a first inverter having a first n-channel type MISFET and a first p-channel type MISFET connected in series each other, being formed on a first region in the multiple layered substrate;
   c) a second inverter having a second n-channel type MISFET and a second p-channel type MISFET connected in series each other, being formed on a second region;
   d) a first wiring connecting the output of the first inverter to the input of the second inverter;
   e) a second wiring connecting the output of the second inverter to the input of the first inverter;
   f) a first back gate region formed on the first region in the semiconductor substrate;
   g) a second back gate region formed on the second region in the semiconductor substrate;
   (h) a first connecting portion between the first wiring and the second back gate region; and
   (i) a second connecting portion between the second wiring and the first back gate region.

2. The semiconductor device according to claim 1, wherein the first inverter and the second inverter constitute an information memory unit in SRAM.

3. The semiconductor device according to claim 2, further comprising:
   a first data line;
   a second data line;
   a first transistor connected between the output of the first data line and the output of the second inverter; and
   a second transistor connected between the output of the second data line and the output of the first inverter.

4. The semiconductor device according to claim 3, wherein the first back gate region is not extended to the first transistor region and the second back gate region is not extended to the second transistor region.

5. The semiconductor device according to claim 1, wherein the first and second back gate regions are impurity regions formed in the semiconductor substrate.

6. The semiconductor device according to claim 1, wherein the semiconductor substrate is p-type and the first and second back gate regions are n-type impurity regions and the semiconductor substrate is connected to the ground potential.

7. The semiconductor device according to claim 1, wherein the semiconductor substrate is n-type and the first and second back gate regions are p-type impurity regions and the semiconductor substrate is connected to the source potential.

8. The semiconductor device according to claim 1, wherein the first connecting portion includes a gate wiring for first n-channel type MISFEET or a first p-channel type MISFET and the second connecting portion includes a gate wiring for a second n-channel type MISFEET or a second p-channel type MISFET.

9. The semiconductor device according to claim 1, wherein the first and second n-channel type MISFETs and the first and second p-channel type MISFETs are a fully-depleted type.

10. An electronic apparatus including the semiconductor device according to claim 1.

11. A logic circuit comprising:
a multiple layered substrate including a semiconductor substrate, an insulation film formed on the semiconductor substrate, and a semiconductor film; and
first and second inverters connected with crossing each other, formed on the multi layered substrate,
wherein first back gate portions of a first n-channel type MISFET and a first p-channel type MISFET constituting the first inverter have the same potential, located in the semiconductor substrate and are connected to the output of the second inverter,
wherein second back gate portions of a second n-channel type MISFET and a second p-channel type MISFET constituting the second inverter have the same potential, located in the semiconductor substrate and are connected to the output of the first inverter.

12. A logic circuit comprising:
a multiple layered substrate including a semiconductor substrate, an insulation film formed on the semiconductor substrate, and a semiconductor film,
a first and second inverters connected in series each other, formed on the multi layered substrate,
wherein first back gate portions of a first n-channel type MISFET and a first p-channel type MISFET constituting the first inverter have the same potential, located in the semiconductor substrate and are connected to the output of the second inverter,
wherein second back gate portions of a second n-channel type MISFET and a second p-channel type MISFET constituting the second inverter have the same potential, located in the semiconductor substrate and are connected to the output of the first inverter.

* * * * *